(12) United States Patent
Koestler

(10) Patent No.: US 11,063,170 B2
(45) Date of Patent: Jul. 13, 2021

(54) TWO-STEP HOLE ETCHING PROCESS

(71) Applicant: AZUR SPACE Solar Power GmbH, Heilbronn (DE)

(72) Inventor: Wolfgang Koestler, Heilbronn (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 0 days.

(21) Appl. No.: 17/007,545

(22) Filed: Aug. 31, 2020

(65) Prior Publication Data
US 2021/0066534 A1 Mar. 4, 2021

(30) Foreign Application Priority Data
Aug. 29, 2019 (DE) .................. 10 2019 006 094.6

(51) Int. Cl.
*H01L 31/18* (2006.01)
*H01L 31/0687* (2012.01)
(52) U.S. Cl.
CPC ........ *H01L 31/1808* (2013.01); *H01L 31/186* (2013.01); *H01L 31/1876* (2013.01)
(58) Field of Classification Search
CPC ............... H01L 31/1808; H01L 31/186; H01L 31/1876; H01L 31/18; H01L 31/02245; H01L 31/0687
See application file for complete search history.

(56) References Cited

U.S. PATENT DOCUMENTS 9,246,046 B1 * 1/2016 Harrington ..... H01L 31/035281
9,680,035 B1 * 6/2017 Chary ............... H01L 31/03048
(Continued)

FOREIGN PATENT DOCUMENTS

| CN | 103441155 A | 12/2013 |
|---|---|---|
| EP | 1953828 A1 | 8/2008 |
| RU | 2354009 C1 | 4/2009 |

OTHER PUBLICATIONS

De Lafontaine Mathieu et al: "High Aspect Ratio and Low Damage III-V/Ge Heterostructure via Etching" Plasma Etch and Strip in Microelectronics (PESM), 11$^{th}$ International Workshop, Grenoble, France, May 20-21, 2019, HAL CCSD, FR, pp. 1-18, XP009524148, URL: https://hal.archives-ouvertes.fr/hal-02324782/.
(Continued)

*Primary Examiner* — Earl N Taylor
(74) *Attorney, Agent, or Firm* — Muncy, Geissler, Olds & Lowe, P.C.

(57) ABSTRACT

A two-step hole etching method including: providing a semiconductor wafer which has a plurality of solar cell stacks and performing a first and a second processing step. In the first processing step, a first resist layer is applied to a top surface of the semiconductor wafer, at least a first opening is produced in the first resist layer and, via a first etching process, a hole which extends beyond a p/n junction of the Ge sub-cell into the semiconductor wafer is produced in the area of the first opening. In the second process step a second resist layer is applied to the top surface of the semiconductor wafer, a second opening greater than the first opening and surrounding the hole is produced in the second resist layer, and, the hole is widened in an area which extends to the Ge sub-cell serving as an etch stop layer.

14 Claims, 2 Drawing Sheets

(56) References Cited

U.S. PATENT DOCUMENTS

| | | | |
|---|---|---|---|
| 2008/0185038 A1* | 8/2008 | Sharps | H01L 31/06875 136/255 |
| 2016/0043252 A1* | 2/2016 | Nagano | H01L 31/1888 368/205 |
| 2021/0066517 A1* | 3/2021 | Koestler | H01L 31/02167 |
| 2021/0066519 A1* | 3/2021 | Koestler | H01L 31/035281 |
| 2021/0066532 A1* | 3/2021 | Frey | H01L 31/184 |
| 2021/0066534 A1* | 3/2021 | Koestler | H01L 31/0687 |

OTHER PUBLICATIONS

Olivier Richard et al: "Through cell vias contacts for multijuntion solar cells", Bd. 1679, 2015, p. 060003, XP055288761, New York, US, ISSN: 0094-243X.

De Lafontaine Mathieu et al: "Influence of plasma process on III-V/Ge multijunction solar cell via etching" Solar Energy Materials and Solar Cells, Bd. 195, Mar. 4, 2019, pp. 49-54, XP085651399, ISSN: 0927-0248.

De Lafontaine Mathieu et al: "Impact of via Hole Integration on Multijunction Solar Cells for Through Cell via Contacts and Associated Passivation Treatment" IEEE Journal of Photovoltaics, Bd. 7, Nr. 5, Aug. 18, 2017, pp. 1456-1461, XP055751765, ISSN: 2156-3381.

De Lafontaine Mathieu et al: "Via sidewall insulation for through cell via contacts", AIP Conference Proceedings, Bd. 1881, 2017, pp. 040002-1 XP055579508, New York, US, ISSN 0094-243X.

De Lafontaine Mathieu et al: "Anisotropic and Low Damage III-V/Ge Heterostructures via Etching for Multijunction Photovoltaic Cell Fabrication", Plasma Etch and Strip in Microelectronics (PESM), $10^{th}$ International Workshop, Leuven, Belgium, Oct. 19-20, 2017, Belgium, pp. 1-17, XP009524147, URL: https://hal.univ-grenoble-alpes.fr/hal-01929191.

Oliva E et al: "III-V Multi-junction Metal-Wrap-Through (MWT) Concentrator Solar Cells", Presented at the $32^{nd}$ European PV Solar Energy Conference and Exhibition, Munich, 2016, pp. 1367-1371.

Dissertation Florian Clement; "Die Metal Wrap Through Solarzelle-Entwicklung und Charakterisierung".

* cited by examiner

TWO-STEP HOLE ETCHING PROCESS

This nonprovisional application claims priority under 35 U.S.C. § 119(a) to German Patent Application No. 10 2019 006 094.6, which was filed in Germany on Aug. 29, 2019, and which is herein incorporated by reference

BACKGROUND OF THE INVENTION

Field of the Invention

The present invention relates to a two-step hole etching process.

Description of the Background Art

To reduce the shading of the front side of a solar cell, it is possible to arrange both the positive and the negative external contact surface on the rear side. In so-called metal wrap through (MWT) solar cells, the solar cell front side, for example, is contacted through a passage contact opening from the rear side.

Different methods are known for producing a hole or a passage contact opening through a solar cell.

From "Die Metal Wrap Through Solarzelle—Entwicklung and Charakterisierung [The metal wrap through solar cell—development and characterization]", F. Clement, thesis, February 2009, a manufacturing process for a MWT single solar cell made of multi-crystalline silicon is known, wherein the passage contact openings are produced by means of a UV laser or an IR laser in an mc-Si substrate layer.

Only then is an emitter layer created by means of the phosphorus diffusion along the top surface, the side surfaces of the passage contact opening and the underside of the solar cell. The passage contact opening is filled with a conductive via paste, for example a silver paste, by means of screen printing.

With the laser, a very smooth side surface in the area of the passage opening can be achieved. Moreover, no undercuts occur in a laser ablation process. However, producing a hole through an existing p/n junction using laser ablation would lead to short circuits.

From "III-V multi-junction metal-wrap-through (MWT) concentrator solar cells", E. Oliva et al., Proceedings, $32^{nd}$ European PV Solar Energy Conference and Exhibition, Munich, 2016, pp. 1367-1371, an inverted grown GaInP/AlGaAs solar cell structure with passage contact openings is known, wherein the solar cell structure with the p/n junctions is epitaxially grown and only then are the passage contact openings produced by means of dry etching. A side surface of the passage opening is then coated with an insulating layer and the passage openings are then filled with galvanized copper.

U.S. Pat. No. 9,680,035 discloses a solar cell stack of multiple III-V sub-cells on a GaAs substrate with a back-contacted front side, wherein a hole which extends from the top of the solar cell through the sub-cells up into a not-yet-thinned substrate layer is produced by means of a wet chemical etching process.

The etching process is based on the fact that the etching rates do not differ significantly, at least for the different III-V materials used in the solar cell stack. The hole is opened downward only by thinning the substrate layer. Passivation and metallization of the front side and the hole is carried out prior to thinning the substrate layer.

Wet chemical etching has the advantage over corresponding dry etching processes that the side walls of the hole have a smoother surface and the passivation layer can be deposited conformally and without defects.

SUMMARY OF THE INVENTION

It is therefore an object of the present invention to provide a device which further develops the prior art.

According to an exemplary embodiment of the invention, a two-step hole etching process is provided, at least comprising the steps: providing a semiconductor wafer having a top surface and an underside, comprising a plurality of solar cell stacks, each comprising, in the named order, a Ge substrate forming the underside, a Ge sub-cell and at least two III-V sub-cells, and performing a first process step and a second process step in the named order.

In the first process step, a first resist layer is applied to the top surface of the semiconductor wafer, at least one first opening is created in the first resist layer, and, by means of a first etching process, a hole is created in the area of the first opening which extends from the top surface of the semiconductor wafer through the III-V sub-cells at least beyond a p/n junction of the Ge sub-cell into the semiconductor wafer.

In the second process step, a second resist layer is applied to the top surface of the semiconductor wafer, a second opening surrounding the hole which is larger than the first opening is created in the second resist layer and, by means of a second etching process, the hole in the area of the second opening is widened in an area which extends from the top surface of the semiconductor wafer to the Ge sub-cell serving as an etch stop layer.

It is understood that the first resist layer should be removed between the process steps.

The individual sub-cells of the solar cell stacks each have a p/n junction and that the layers following the substrate are epitaxially produced on one another and/or are connected to one another by means of wafer bonding.

In addition, it is understood that a Ge sub-cell comprises germanium or consists of germanium, wherein a layer formed substantially of germanium may also contain other substances in addition to the germanium, in particular dopants, but also impurities. The same applies to the III-V sub-cells, which comprise one or more materials of the III and the V main group or consist of such materials.

Dividing the production of the hole into two process steps or two different etching processes makes it possible to in each case adapt the etching processes to the different materials.

Thus, in the first etching process, all sub-cells are etched, i.e., the III-V materials of the III-V sub-cells and possibly other III-V layers as well as the Ge sub-cell, while in the second etching process only the III-V materials of the III-V sub-cells and possibly other III-V layers are selectively etched and the Ge sub-cell serves as a stop layer.

Possible other III-V layers can be buffer layers or a top layer, also known as a cap layer.

The order in particular prevents underetching in the produced hole, which would make it more difficult for further layers, such as a passivation layer, to adhere. The first etching process typically leads to underetching in the area of the Ge sub-cell, i.e., underneath the III-V sub-cells.

As the hole in the area of the III-V sub-cells is widened in the second process step, the underetchings again disappear. Moreover, the second etching process leads to relatively smooth surfaces free of underetchings in the area of the III-V sub-cells.

The produced hole has a circumferential step formed by the top surface of the Ge sub-cell, on which a hole diameter suddenly decreases downwards.

The method thus ensures that no underetchings or undercuts are formed in the area of the passage opening. This is necessary so that a passivation over the entire length of the passage opening, especially in the area of the edges or steps, reliably adheres, and that no defects form in the passivation layer. Any defects could lead to short circuits of the sub-cells.

A passage opening, i.e., an opening of the hole through the remaining sub-cell and the Ge substrate, is then possible in a simple and quick manner, for example by means of laser ablation, without the p/n junctions being damaged or short circuits occurring.

In a further development, the hole etched in the two process steps shows an aspect ratio of depth to average width of at most 0.05 or at most 0.01 in a first region which extends from the top surface of the semiconductor wafer to a top surface of the Ge sub-cell.

For example, the depth of the hole is between 5 µm and 15 µm, whereas the height is between 300 µm and 500 µm.

The total height of the hole is substantially determined by the layer thicknesses of the sub-cells. While the at least two III-V sub-cells should be completely penetrated by the hole, the depth of penetration in the Ge sub-cell is determined according to the position of the p/n junction of the Ge sub-cell. The hole is etched at least so far into the Ge sub-cell that there is a hole bottom below the p/n junction.

The depth of the hole is substantially already obtained with the first process step, i.e., achieved with the first etching process, while the greatest width, that is the width in the upper area of the hole, is obtained with the second process step, i.e., the second etching process.

In another embodiment, the III-V sub-cells of the provided semiconductor wafers have a common layer thickness of 5-15 µm or 6-8 µm.

The hole created in the first and second process step can have a diameter of at least 300 µm or at least 400 µm or at least 450 µm on the top surface of the semiconductor wafer, wherein the diameter is not greater than 1 mm. It is understood that the width at the top surface of the semiconductor wafer is essentially determined by the second process step, that is to say the second opening in the second resist layer and the second etching process.

In a first region which extends from the top surface of the semiconductor wafer to a top surface of the Ge sub-cell, the hole produced in the first and second process step includes a diameter which is constant or decreases with increasing depth, wherein an angle of the side surfaces between the first region and a perpendicular line of a bottom surface of the hole amounts to at most 10° or at most 2° or at most 1° or at most 0.1°.

The hole created in the first and second process step can have a diameter of at least 150 µm or at least 200 µm in an area which extends from a top surface of the Ge sub-cell into the Ge sub-cell. It is understood that the width at the top surface of the Ge sub-cell is essentially determined by the first process step, i.e., the first opening in the first resist layer and the first etching process.

The Ge sub-cell in conjunction with the Ge substrate layer of the semiconductor wafer provided can have a layer thickness of 80-300 µm or 140-160 µm or 80-120 µm.

The provided semiconductor wafer is produced by growing and/or wafer-bonding the sub-cells on a Ge substrate with a layer thickness of at least 400 µm, and then thinning the Ge substrate to a thickness of at most 300 µm or at most 200 µm or at most 100 µm.

The hole created in the first and second process step can have a depth of 1-4 µm or 1-3 µm or 2 µm from the top surface of the Ge sub-cell to the bottom surface of the hole. In the first process step, the hole is at least etched so far into the Ge sub-cell that it proceeds beyond the position of the p/n junction of the Ge sub-cell.

The first etching process and/or the second etching process can be a wet chemical etching process. Alternatively, the first etching process and/or the second etching process are a dry etching process.

After the second process step, a protective resist may be applied to the top surface of the semiconductor wafer and to all surfaces of the hole and, by means of laser ablation, a passage opening which extends from a bottom surface of the hole to the underside of the semiconductor wafer is produced.

A passage opening allows for guiding front-side contacts to the rear side, thus reducing the shading of the front side of the solar cells. The protective resist protects in particular all p/n junctions of the solar cell stacks from being melted by the action of the laser. In addition, the protective resist protects all surfaces from the build-up of smoke residue that arises during the ablation process.

The diameter of the passage opening created by the laser ablation can be at most 60% or at most 20% or at most 10% of the diameter of the hole at the top surface of the semiconductor wafer.

The first opening and/or the second opening can have an oval circumference. The openings of the resist layers are, for example, circular or even elliptical.

In the first process step, at least one first opening is produced in the first resist layer above each solar cell stack of the semiconductor wafer. In a further development, exactly two openings are created for each solar cell stack.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
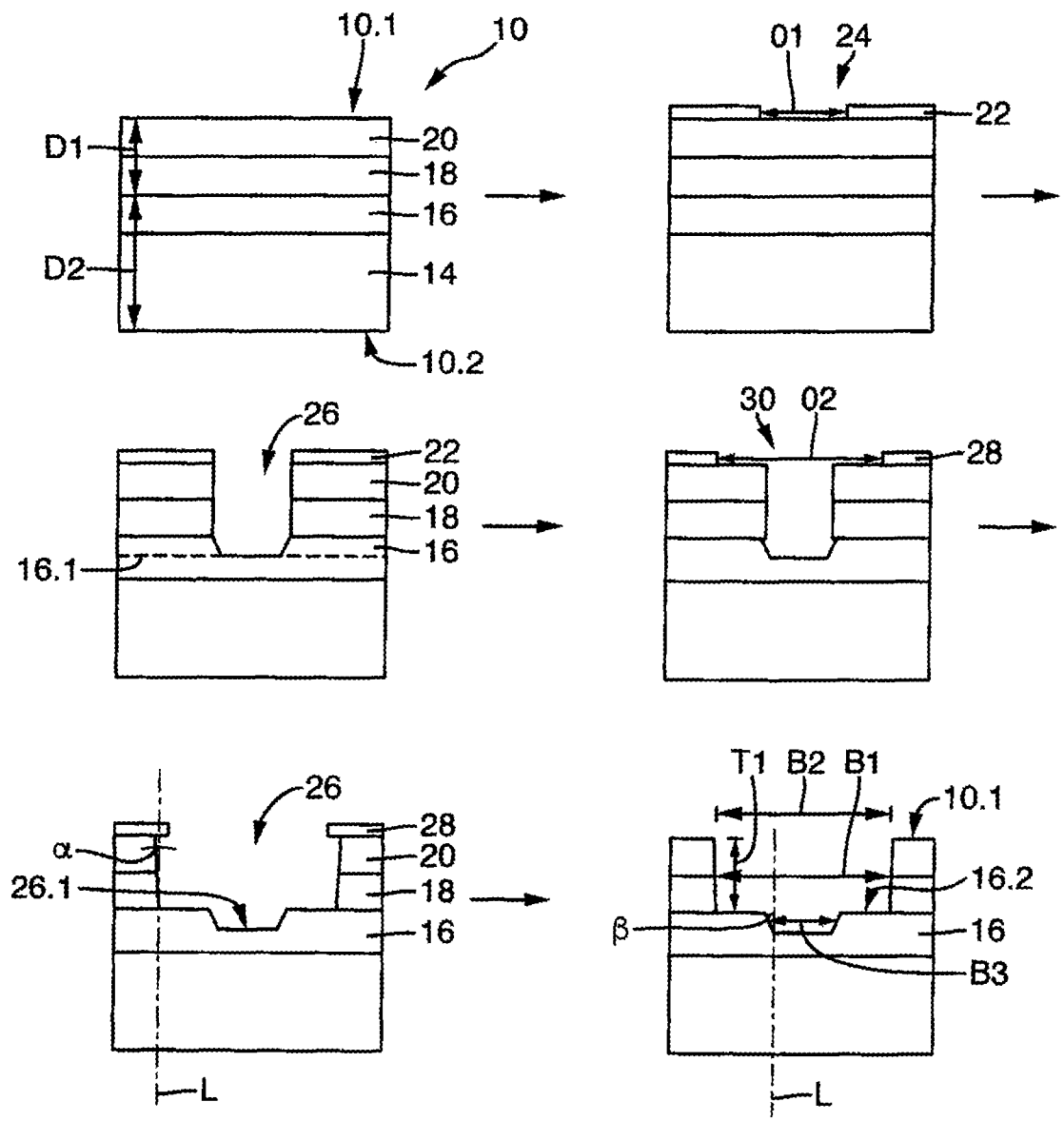
FIG. 1 is a sequence according to an exemplary embodiment of a two-step hole etching method.

The illustration of FIG. 1 shows a schematic sequence of a two-step hole etching method according to a first inventive embodiment.

Illustrated is a semiconductor wafer 10 with a top surface 10.1, an underside 10.2 and a plurality of solar cell stacks, each formed of a layer sequence of a Ge substrate 14 forming the underside 10.2, a Ge sub-cell 16, a first III-V sub-cell 18 and a second III-V sub-cell 20 forming the top surface 10.1. Only a sectional view of a portion of a semiconductor wafer 10 is shown, in which a hole is to be produced.

The Ge sub-cell 16 in conjunction with the Ge substrate 14 has a first common layer thickness D1 and the two III-V sub-cells 18, 20 have a common second layer thickness D2.

In a first process step, a first resist layer 22 is applied to the top surface 10.1 of the semiconductor wafer 10, and a first opening 24 with a diameter O1 is created in the resist layer 22. Subsequently, the material of the semiconductor wafer 10 is non-selectively removed in the area of the opening 24 by means of a first etching process.

The first etching process is stopped when the resulting hole 26 extends through a p/n junction 16.1 of the Ge sub-cell 16 into the semiconductor wafer 10, such that the bottom surface 26.1 of the hole 26 is located beneath the p/n junction 16.1.

Subsequently, the first resist layer 22 is removed and, in a second process step, a second resist layer 28 is applied to the top surface 10.1 of the semiconductor wafer 10. A second opening 30 is formed In the second resist layer 28, wherein the second opening 30 has a second diameter O2 which is greater than the first diameter and the hole 26.

By means of a second etching process, the material of the two III-V sub-cells is then removed in the area of the second opening 30 to the Ge sub-cell 16 serving as an etch stop layer, as a result of which the hole 26 becomes wider in a region above the Ge sub-cell 16.

Then, also the second resist layer 28 is again removed.

The hole 26 produced has a diameter B2 on the top surface 10.1 of the semiconductor wafer 10. A diameter B1 of the hole 26 in the area of the two III-V sub-cells 16 and 18 is either constant or decreases in the direction of the Ge sub-cell, so that a side surface of the hole 26 in the region of the III-V sub-cells 16 and 18 extends at an angle $\alpha$ to a perpendicular line L.

A top surface 16.2 of the Ge sub-cell 16 forms a step which projects into the hole 26, as a result of which the diameter of the hole on the Ge sub-cell top surface 16.2 is reduced to a diameter D3. The diameter decreases in the area of the Ge sub-cell so that a side surface of the hole in the area of the Ge sub-cell includes an angle $\beta$ with a perpendicular line L.

Figure 2:
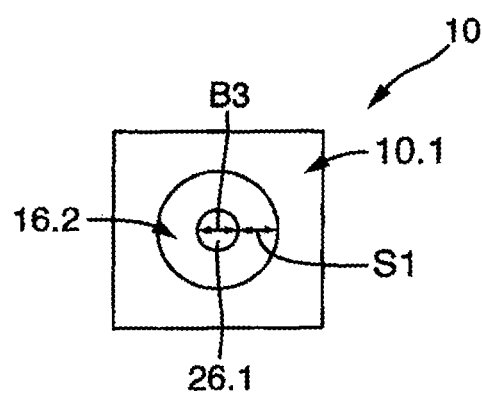
FIG. 2 is a plan view of a semiconductor wafer with a hole produced by means of the inventive method.

FIG. 2 shows a plan view of a first portion of a semiconductor wafer 10, which includes a hole produced by the two-step etching process. In the exemplary embodiment shown, the hole is circular, wherein both the hole bottom 26.1 and the edge of the hole 26 adjoining the top surface 10.1 of the semiconductor wafer 10 have a circular circumference or path.

In the plan view, the hole bottom 26.1 is enclosed by the step S1, which is formed by the top surface 16.2 of the Ge sub-cell 16.

Figure 3:
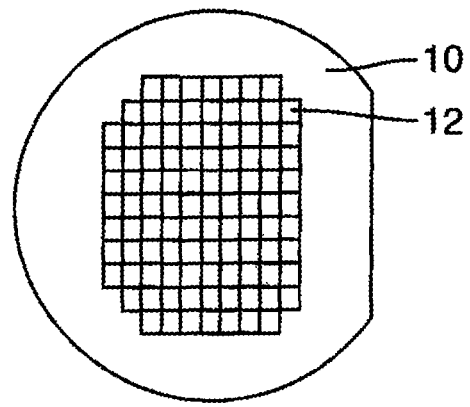
FIG. 3 is a plan view of a semiconductor wafer with a plurality of solar cell stacks.

FIG. 3 shows a plan view of a semiconductor wafer 10 having a plurality of solar cell stacks. At least one hole is produced in the region of each solar cell stack by means of the two-step etching process, for which purpose at least one opening is created above each solar cell stack in the first process step, prior to the first etching process, and corresponding second openings are produced in the second process step.

Figure 4:
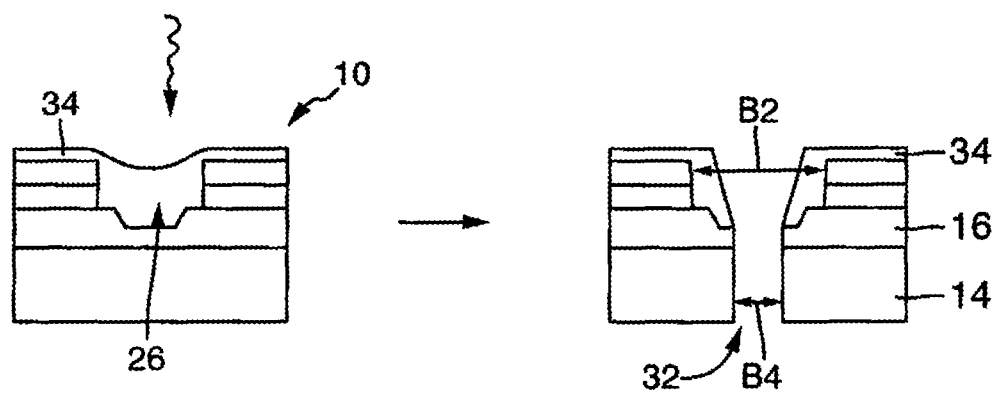
FIG. 4 is a schematic sequence of further method steps.

Further method steps are shown schematically in the illustration in FIG. 4. After producing the at least one hole 26 in the semiconductor wafer 10, that is, after the second processing step, the top surface 10.1 of the semiconductor wafer 10 is coated with a protective resist 34.

Here, the hole 26 is at least partially filled with the protective resist 34, or the protective resist 34 also covers at least the surface of the hole 26. Then, in the region of the bottom 26.1 of the hole 26, a passage opening 32 having a diameter B4 is created through the protective resist 34 and a remaining part of the Ge sub-cell 16 and the Ge substrate 14 by means of laser ablation.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A two-step hole etching method comprising:
providing a semiconductor wafer having a top surface and an underside, the semiconductor wafer comprising at least two solar cell stacks, each comprising, in the named order, a Ge substrate forming the underside, a Ge sub-cell and at least two III-V sub-cells; and
performing a first process step and a second process step in the named order,
wherein, in the first process step, a first resist layer is applied to the top surface of the semiconductor wafer, at least a first opening is produced in the first resist layer and, via a first etching process, a hole which extends from the top surface of the semiconductor wafer through the III-V sub-cells at least beyond a p/n junction of the Ge sub-cell into the semiconductor wafer is produced in an area of the first opening, and
wherein, in the second process step, a second resist layer is applied to the top surface of the semiconductor wafer, a second opening, which is greater than the first opening, and surrounds the hole is produced in the second resist layer, and, via a second etching process, the hole is widened in a region of the second opening in an area that extends from the top surface of the semiconductor wafer to the Ge sub-cell serving as an etch stop layer.

2. The method according to claim 1, wherein the hole created in the first and second process step has an aspect ratio of a depth to an average width of at most 0.05 or at most 0.01 in a first area which extends from the top surface of the semiconductor wafer to a top surface of the Ge sub-cell.

3. The method according to claim 1, wherein the III-V sub-cells of the semiconductor wafer provided have a common layer thickness of 5-15 μm or 6-8 μm.

4. The method according to claim 1, wherein the hole produced in the first and second process step has a diameter of at least 300 μm or at least 400 μm or at least 450 μm at the top surface of the semiconductor wafer, and wherein a diameter is not greater than 1 mm.

5. The method according to claim 1, wherein the hole produced in the first and second process step has a diameter that is constant or decreases with increasing depth in a first region that extends from the top surface of the semiconductor wafer to a top surface of the Ge sub-cell, and wherein an angle between side surfaces of the first region and a perpendicular line of a bottom surface of the hole is at most 10° or at most 2° or at most 1° or at most 0.1°.

6. The method according to claim 1, wherein the hole produced in the first and second process step has a diameter of at least 150 μm or at least 200 μm in a region that extends from a top surface of the Ge sub-cell into the Ge sub-cell.

7. The method according to claim 1, wherein the Ge sub-cell in conjunction with the Ge substrate layer of the semiconductor wafer provided has a layer thickness of 80-300 μm or 140-160 μm or 80-120 μm.

8. The method according to claim 1, wherein the hole produced in the first and second process step has a depth of 1-4 μm or 1-3 μm or 2-5 μm from a top surface of the Ge sub-cell to a bottom surface of the hole.

9. The method according to claim 1, wherein the first etching process and/or the second etching process are a wet chemical etching process.

10. The method according to claim 1, wherein the first etching process and/or the second etching process are a dry etching process.

11. The method according to claim 1, wherein, after the second process step, a protective resist is applied to the top surface of the semiconductor wafer and to all surfaces of the hole and, by means of laser ablation, a passage opening that extends from a bottom surface of the hole to the underside of the semiconductor wafer is produced.

12. The method according to claim 11, wherein a diameter of the passage opening created by means of the laser ablation is at most 60% or at most 20% or at most 10% of a diameter of the hole on the top surface of the semiconductor wafer.

13. The method according to claim 1, wherein the first opening and/or the second opening have an oval circumference.

14. The method according to claim 1, wherein, in the first process step, at least one first opening is produced in the first resist layer above each solar cell stack of the semiconductor wafer.

* * * * *